(12) United States Patent
Allano et al.

(10) Patent No.: US 8,890,133 B2
(45) Date of Patent: Nov. 18, 2014

(54) SUPPORT WITH A DIFFUSING LAYER FOR AN ORGANIC LIGHT-EMITTING DIODE DEVICE, AND ORGANIC LIGHT-EMITTING DEVICE COMPRISING SUCH A SUPPORT

(75) Inventors: Jean-Luc Allano, Deuil la Barre (FR); Marie-Virginie Ehrensperger, Aix les Bains (FR); Sylvie Abensour, Montlignon (FR)

(73) Assignee: Saint-Gobain Glass France, Courbevoie (FR)

( * ) Notice: Subject to any disclaimer, the term of this patent is extended or adjusted under 35 U.S.C. 154(b) by 0 days.

(21) Appl. No.: 13/814,428

(22) PCT Filed: Aug. 5, 2011

(86) PCT No.: PCT/FR2011/051874
§ 371 (c)(1),
(2), (4) Date: May 15, 2013

(87) PCT Pub. No.: WO2012/017183
PCT Pub. Date: Feb. 9, 2012

(65) Prior Publication Data
US 2013/0221336 A1    Aug. 29, 2013

(30) Foreign Application Priority Data

Aug. 6, 2010   (FR) ...................................... 10 56499

(51) Int. Cl.
*H01L 51/52*  (2006.01)
*C03C 17/00*  (2006.01)
*C03C 3/066*  (2006.01)
*C03C 17/42*  (2006.01)

(52) U.S. Cl.
CPC ......... *H01L 51/52* (2013.01); *H01L 2251/5369* (2013.01); *C03C 2217/452* (2013.01); *C03C 17/007* (2013.01); *C03C 3/066* (2013.01); *H01L 51/5268* (2013.01); *C03C 2218/365* (2013.01); *H01L 51/5262* (2013.01); *C03C 2217/46* (2013.01); *C03C 17/42* (2013.01)
USPC ............................................ 257/40; 428/432

(58) Field of Classification Search
CPC ...................................................... H01I 2227/00
USPC ............................................................ 257/40
See application file for complete search history.

(56) References Cited

U.S. PATENT DOCUMENTS

2010/0187987 A1   7/2010   Nakamura
2011/0278622 A1*  11/2011  Wada et al. ..................... 257/98

FOREIGN PATENT DOCUMENTS

FR          2 937 467        4/2010
WO     WO 2010/084922        7/2010
WO     WO 2010/084925        7/2010

OTHER PUBLICATIONS

International Search Report as issued for International Application No. PCT/FR2011/051874, dated Dec. 5, 2011.

*Primary Examiner* — Whitney T Moore
(74) *Attorney, Agent, or Firm* — Pillsbury Winthrop Shaw Pittman LLP

(57) ABSTRACT

A support for an organic light-emitting diode device successively includes a transparent substrate, made of mineral glass, provided with first and second opposite main faces, the substrate being coated on its second face with a diffusing layer which includes a vitreous mineral binder and diffusing elements dispersed in the binder, the vitreous binder includes between 40% and 60% by weight of bismuth oxide $Bi_2O_3$ inclusive of these values, or even between 45% and 58% by weight of bismuth oxide $Bi_2O_3$ inclusive of these values, and the proportion of the vitreous binder is at least 20% of the total weight of the diffusing layer.

24 Claims, 3 Drawing Sheets

SUPPORT WITH A DIFFUSING LAYER FOR AN ORGANIC LIGHT-EMITTING DIODE DEVICE, AND ORGANIC LIGHT-EMITTING DEVICE COMPRISING SUCH A SUPPORT

CROSS-REFERENCE TO RELATED APPLICATIONS

This application is the U.S. National Stage of PCT/FR2011/051874, filed Aug. 5, 2011, which in turn claims priority to French Application No. 1056499 filed Aug. 6, 2010. The content of these applications are incorporated herein by reference in their entirety.

The present invention relates to a support for an organic light-emitting diode device. It relates more particularly to a support for an organic light-emitting diode device comprising a transparent glass substrate coated with a diffusing layer, and to such a device.

An OLED (organic light-emitting diode) comprises an organic electroluminescent material, or a stack of organic electroluminescent materials, and is flanked by two electrodes, one of the electrodes, referred to as the bottom electrode, generally the anode, consisting of that associated with a glass substrate and the other electrode, referred to as the top electrode, generally the cathode, being placed on the organic light-emitting system.

An OLED is a device which emits light via electroluminescence using the recombination energy of holes injected from the anode and of electrons injected from the cathode.

Various OLED configurations exist:
bottom-emission devices, that is to say devices with a (semi) transparent bottom electrode and a reflective top electrode;
top emission devices, that is to say devices with a (semi) transparent top electrode and a reflective bottom electrode;
top and bottom emission devices, that is to say devices with both a (semi) transparent bottom electrode and a (semi) transparent top electrode.

The invention relates to bottom emission and optionally also top emission OLED devices.

An OLED generally finds its application in a display screen or more recently in a lighting device.

For a lighting system, of the lamp type, the light extracted from the OLED is a "white" light emitting in certain, or even all, of the wavelengths of the spectrum. The light must furthermore be emitted uniformly. By this it is meant, more precisely, that the emission is lambertian, that is to say it obeys Lambert's law by being characterized by a photometric luminescence equal in all directions.

An OLED nevertheless has a low light extraction efficiency: the ratio of the light that actually leaves the glass substrate to that emitted by the electroluminescent materials is relatively low, around 0.25.

This phenomenon is explained in particular by the reflection of the light within the glass substrate due to the difference in the refractive index between the glass of the substrate (n=1.5) and the air outside the device (n=1).

Furthermore, it was observed that the colorimetric variation as a function of the angle of observation depends very strongly on the nature of the stack of the organic electroluminescent materials and electrodes used. The requirements in terms of uniformity of the lighting for use of the light-emitting device as a lighting source in particular may thus not be achieved.

Solutions are therefore sought for improving the efficiency of an OLED, namely for increasing the extraction gain while providing white light that is as uniform as possible. The term "uniform" is understood in the rest of the description to mean intensity uniformity, color uniformity and uniformity in space.

Interest is taken here in solutions relating to the glass substrate, at the glass-air interface, which require geometric optics.

Known in particular from document FR 2 937 467 is an OLED device, the mineral glass substrate of which comprises on the main face opposite that bearing the first electrode, a diffusing layer comprising a mineral binder and diffusing particles dispersed in the binder, and also particles dispersed in the binder that absorb ultraviolet (UV) radiation in the wavelength range from 325 to 400 nm.

The binder is obtained from a glass frit, or potassium, sodium or lithium silicate.

The diffusing particles are particles of alumina or else $BaSO_4$, $ZrO_2$, $SiO_2$ or $CaCO_3$.

The proportion of the binder is of the order of 30% to 70% of the total weight of the diffusing layer, and the proportion of the diffusing particles is of the order of 25% to 60% of the total weight of the layer, and the proportion of particles that absorb UV radiation is between 2% and 15% of the total weight of the layer.

A preferred example of a diffusing and anti-UV layer having a thickness of 11 μm is the following:
52% of fused glass frit;
40% of alumina;
8% of particles that absorb UV radiation, preferably 4% of $TiO_2$ and 4% of ZnO.

The diffusing layer is added to the substrate by screen printing or any other suitable technique such as by coating, by impregnation in solution (dip-coating), by spraying, etc.

The diffusing function of this layer enables a "re-mixing" of the colors forming the white light, which makes it possible to extract a much more uniform light.

This also makes it possible to reduce the colorimetric variations perceived by an observer facing the device.

However, it has been observed that the scrap rate of this OLED device was significant.

The objective set by the invention is in particular to succeed in producing a robust. OLED device without sacrificing the optical performances of the OLED (in particular the extraction of light and/or the limitation of the colorimetric variation as a function of the angle of observation of the chosen polychromatic, in particular white, light emitted) or even to improve them, and without giving rise to production difficulties.

Another important objective is to make it possible to manufacture such a device which is compatible with the manufacturing process of the OLED device.

The present invention proposes, for this purpose, a support for an organic light-emitting diode device successively comprising a transparent substrate, made of mineral glass, provided with first and second opposite main faces, the substrate being coated (directly) on its second face with a diffusing layer which comprises an (essentially) mineral binder and diffusing elements dispersed in the binder, the vitreous binder comprising between 40% and 60% by weight of bismuth oxide $Bi_2O_3$ inclusive of these values, or even between 45% and 58% by weight of bismuth oxide $Bi_2O_3$ inclusive of these values, the proportion of the vitreous binder is at least 20% of the total weight of the diffusing layer.

The suitable proportion of bismuth oxide in the diffusing layer according to the invention (a single-layer or multilayer) guarantees a reinforced chemical resistance.

However, within the context of the manufacture of OLEDs, various steps capable of degrading the diffusing layer take place:
- cleaning of the substrate, conventional use of organic solvents (ethanol, acetone) or of a basic solution (generally sodium hydroxide);
- etching of the first electrode (the closest one to the substrate) on the first face;
- optionally removing a resist that is used to define the patterns to be etched, conventional use of organic solvents (ethanol, acetone, etc.) or of a basic solution (generally sodium hydroxide).

Surprisingly, due to the choice of its binder, having a high content of bismuth oxide, the diffusing layer according to the invention withstands these various chemical treatments that the substrate undergoes during the production of the OLED, unlike conventional frits.

The vitreous binder may be that which a person skilled in the art refers to as an enamel or a fused glass frit.

Thus, the diffusing layer according to the invention makes it possible to:
- conserve the extraction of light from the OLED;
- be compatible with the various steps of the process for manufacturing an OLED.

The diffusing layer preferably has a main outer surface that is open to the air.

Throughout the description, the substrate according to the invention is considered to be laid horizontally, with its first face oriented downward and its second face, opposite the first face, oriented upward; the meanings of the expressions "above" and "below" should thus be considered relative to this orientation. Unless specifically stipulated, the expressions "above" and "below" do not necessarily mean that the two elements are positioned in contact with one another.

The terms "bottom" and "top" are used here in reference to this positioning.

Throughout the description, the term "index" refers to the optical refractive index, measured at the wavelength of 590 nm.

The chemical resistance of the diffusing layer of vitreous material according to the invention may be intensified by the fact that the binder has a composition of water-soluble oxides that is small. The water-soluble oxides, in particular the alkali metal oxides of sodium and potassium type, preferably have a content of less than 15% by weight and more preferably still are less than 5%.

Advantageously, the vitreous binder of the diffusing layer (single-layer or multilayer) according to the invention comprises, by weight:
- between 0% and 10% and preferably between 0% and 5% of $SiO_2$,
- between 0% and 5% and preferably between 0% and 1% of $Al_2O_3$,
- between 8% and 25% and preferably between 10% and 22% of $B_2O_3$,
- between 0% and 10% and preferably between 0% and 5% of CaO,
- between 0% and 20% and preferably between 0% and 15% of BaO,
- between 0% and 5% and preferably between 0% and 3% of $Li_2O$,
- between 0% and 10% and preferably between 0% and 5% of $Na_2O$,
- between 0% and 5% and preferably between 0% and 3% of $K_2O$,
- between 0% and 5% and preferably between 0% and 4% of $ZrO_2$,
- between 0% and 5% of SrO,
- between 0% and 5% of $La_2O_3$, inclusive of these values in the ranges.

The binder according to the invention may preferably comprise between 5% and 30% by weight of ZnO inclusive of these values and preferably between 10% and 25% by weight of ZnO inclusive of these values.

The chemical resistance is further reinforced by the combined action of these two oxides in their specific ranges.

Said diffusing layer according to the invention (single-layer or multilayer) preferably has a (total) thickness between 1 µm and 50 µm inclusive of these values, or even between 5 µm and 30 µm inclusive of these values.

The diffusing elements preferably have a characteristic dimension comparable to or greater than the wavelength of the light in the vitreous medium, which corresponds to dimensions between a few hundred nanometers and a few microns.

The diffusing elements according to the invention may comprise volume porosities (porosities therefore in the layer) or even surface porosities.

The diffusing elements may comprise diffusing particles, in particular of a material having an index different to the index of the substrate, preferably in a proportion of less than 60% of the total weight of the layer, and optionally volume porosities or even surface porosities.

The porosities are naturally present in the diffusing layer while diffusing particles are added ad hoc. Closed porosities favor volume diffusion. Open porosities favor surface diffusion.

The porosities result, for example, from the curing (removal) of the organic medium.

In the presence of diffusing particles in particular having a size of greater than 50 nm, the porosities are large, having a size of greater than 500 nm.

As another diffusing element according to the invention, mention may be made of crystals, such as for example zircon or baddeleyite crystals, naturally present in the diffusing layer.

The diffusing elements according to the invention may comprise mineral diffusing particles, in particular selected from one or more of the following particles: particles of alumina, of zirconia $ZrO_2$, of silica $SiO_2$, of titanium oxide $TiO_2$, of $CaCO_3$ or of $BaSO_4$.

A diffusing layer according to the invention with an (essentially) mineral binder and preferably (essentially) mineral diffusing elements (in particular with at least 80% of mineral diffusing elements in particular including mineral particles, crystals, porosities) have a very good temperature resistance, in particular at around 400° C., so as not to be degraded during the process for manufacturing the whole of the OLED.

In one preferred embodiment, the proportion of the vitreous binder according to the invention is between 40% and 80% of the total weight of the diffusing layer inclusive of these values, in particular between 50% and 75% inclusive of these values, and the proportion of the selected diffusing particles made of alumina is between 20% and 60% inclusive of these values, in particular between 25% and 50% of the total weight of the layer inclusive of these values.

To favor surface diffusion, the diffusing layer according to the invention may have a main outer surface open to the air which is rough, having a roughness defined by a roughness parameter Ra of greater than 500 nm, or even greater than 900 nm over an analysis length of 200 µm.

The roughness of the substrate is characterized by the well-known roughness parameter Ra, which is the arithmetic mean deviation of the profile, expressing the mean amplitude.

For example, a mechanical profilometer is chosen, such as the DEKTAK machine from the company VEECO.

To favor light extraction, the substrate coated with this diffusing layer according to the invention may have a light transmission (TL) of at least 50% and a haze (that is to say the ratio TL/TD where TD is the diffuse transmission) of at least 80%, or even 90%.

The glass substrate may have a conventional index between 1.4 and 1.6 or may be a high index, therefore having an index of greater than or equal to 1.7. The glass substrate has for example a thickness between 0.7 and 6 mm depending on the applications, preferably between 0.7 and 3 mm inclusive of these values. It may be a clear or extra-clear glass. For example, the bare substrate has a TL of at least 80%, or even 90%.

The support according to the invention may comprise several diffusing layers, in particular based on said bismuth oxide-based vitreous binder, each having a different diffusion or even a different chemical resistance:

by eliminating and/or changing the nature of the diffusing particles;
and/or by changing the concentration of the diffusing particles.

At least the last diffusing layer must be chemically resistant. Below, a "conventional" diffusing layer may optionally be chosen, in particular one based on a zinc borate frit.

It is for example possible to produce a diffusion gradient with a gradual reduction of the index in two or more steps (two or more layers) between the substrate and the air.

However, it is possible that at least two layers of vitreous material do not have the same proportion of bismuth oxide $Bi_2O_3$ while remaining within the range of the invention.

It is thus possible that a first diffusing layer comprises between 40% and 60% by weight of bismuth oxide $Bi_2O_3$ inclusive of these values, and that a second diffusing layer of vitreous material (further from the substrate) comprises between 45% and 58% by weight of bismuth oxide $Bi_2O_3$ inclusive of these values.

Furthermore, the diffusing layer (single-layer or multilayer with a separate binder or not, and separate diffusing elements or not) is preferably directly on the second face of the substrate.

For the manufacture of the OLED:
the first transparent electrode, in the form of layer(s), is deposited on the first face of the substrate;
above the first electrode, an organic light-emitting system, in particular an organic coating, which system emits radiation in the visible range, preferably polychromatic radiation, and a second electrode, in the form of layer(s), is deposited on the organic system on the opposite side to the first electrode;
a second electrode, in the form of layer(s), is deposited on the organic system on the opposite side to the first electrode.

The present invention also relates to the use of a support with a diffusing layer as defined previously, as a support in an organic light-emitting diode device for lighting (in particular general lighting).

The diffusing layer according to the invention constitutes a particularly chemically resistant layer while providing a significant gain in the extraction of light leaving the diffusing OLED device according to the invention.

Another advantage provided by the diffusing layer according to the invention is to further reduce the colorimetric variations perceived by an observer facing the diffusing OLED device according to the invention.

The OLED may preferably emit as the output a spectrum of polychromatic, in particular white, light. In order to produce white light, several methods are possible, in particular: mixing the compounds (red, green, blue emission) in a single layer, stacking of three organic structures (red, green, blue emission) or of two organic structures (yellow and blue), series of three adjacent organic structures (red, green, blue emission).

In order to assess the angular dependence of the color (in particular for polychromatic light), once the OLED is produced, the colorimetric variation $V_c$ is evaluated, for example with a spectrophotometer, as a function of the angle of observation, that is to say the length of the path (of various shapes such as a straight line or an arc), in the CIE XYZ 1931 chromaticity diagram, between the spectrum emitted at 0° and the spectrum emitted at 75°, every 5°. The chromaticity coordinates for each spectrum of angle $\theta_i$ are expressed by the pair of coordinates $(x(\theta_i);y(\theta_i))$ in the CIE XYZ 1931 chromaticity diagram.

The path length $V_{c1}$ for the device according to the invention between the spectrum emitted at 0° and the spectrum emitted at 75°, and passing through the intermediate angles with a step of 5°, may therefore be calculated using the following known formula:

$$V_{C1} = \sum_{\theta_i=0}^{\theta_i=75°} \sqrt{(x(\theta_i) - x(\theta_{i+1}))^2 + (y(\theta_i) - y(\theta_{i+1}))^2}$$

The path length should be as short as possible.
Thus:
for a first reference organic light-emitting diode device differentiated by the absence of diffusing layer (or any other added diffusing element such as a diffusing plastic film adhesively bonded to the glass) on the second face, a second path length $V_{c2}$ is defined in an identical manner, and $V_{c1}/V_{c2}$ is obtained of less than or equal to 0.25, or even of less than or equal to 0.2 and even of less than or equal to 0.1 and preferably $V_{c2}$ is less than or equal to $10^{-1}$,
and/or for a second organic light-emitting diode device with a diffusing layer on the second face, a layer that is differentiated by a diffusing layer with a vitreous binder without bismuth oxide, a third path length $V_{c3}$ is defined in an identical manner, and $V_{c1}/V_{c3}$ is obtained of less than or equal to 0.9, or even of less than or equal to 0.7, and even of less than or equal to 0.5, and preferably $V_{c3}$ is less than or equal to $10^{-1}$.

In one example of manufacturing the support as defined previously,
the diffusing layer is deposited on the second face before depositing the first electrode on the first face;
said diffusing layer is deposited from a glass frit, preferably with an organic medium, by screen printing and the glass frit is fused in order to form the vitreous binder and preferably in the presence of diffusing elements comprising diffusing particles.

As already mentioned, the chemical resistance is obtained by the action of the bismuth oxide within its specific range.

In particular, this chemical resistance makes it possible to use the substrate coated with the diffusing layer in processes for manufacturing the OLED device as already seen:
during various cleaning operations, in particular cleaning of the substrate before deposition of the first electrode;

during the step of chemical etching of the first electrode deposited preferably after the diffusing layer.

The substrates must firstly withstand manual or automated cleaning procedures in baths. These cleaning procedures must rid the supports of any trace of organic or mineral material and also any trace of particles before the organic light-emitting system is deposited. Each substrate therefore passes successively in contact with basic and acid detergent solutions with intermediate rinsings between each step. The cleaning power is also often enhanced by the presence of detergents and/or ultrasounds and/or by the use of a temperature close to around 40° C.

One example of a sequence of baths may thus consist of:
a first bath of a solution of deionized water with alkaline detergents intended to dissolve the organic materials deposited or condensed on the surface, then
a second bath for rinsing with hard water intended to rinse and remove possible traces of alkaline detergent, then
a third bath of a solution of deionized water with acid detergent intended to dissolve possible pollutants such as salts of mineral materials or metal oxides, then
a fourth bath of hard water intended to rinse and remove possible traces of acid detergent, then
fifth and sixth baths of demineralized water for removing possible mineral salts originating from the fourth bath of hard water and that are well known for being responsible for marks, in particular on glass substrates.

Each bath is regulated at a temperature of at least 30 to 40° C. and the detergent baths previously named one and two, may be equipped with an ultrasonic source that facilitates the renewal of the active solution and increases the cleaning efficiency. The fifth bath may have an ultrasonic source of higher frequency for the purpose of removing solid particles or fibers.

This example of a sequence intended for cleaning substrates before depositing one (or more) diffusing layer(s) according to the invention can be used for cleaning said layer(s) of vitreous materials:
before any deposition of a supplementary layer or stack (extractive layer on the OLED side, first electrode, etc.) on the side of the first face;
or after deposition of a supplementary layer or stack on the side of the first face.

The present invention is now described with the aid of examples that are purely illustrative and in no way limit the scope of the invention, and from the appended drawings, in which.

Figure 1:
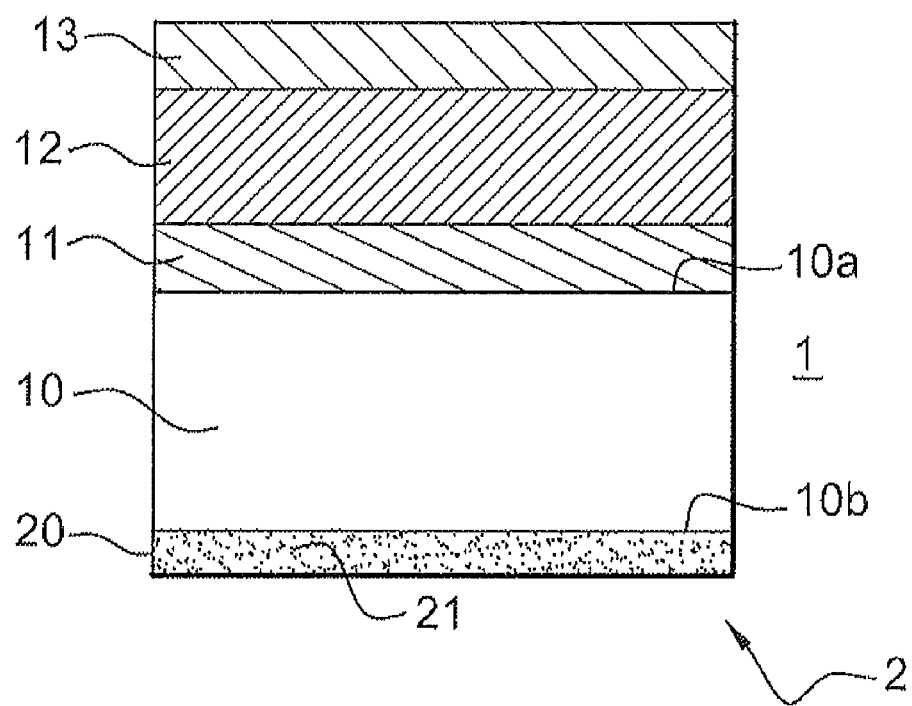
FIG. 1 represents a schematic cross-sectional view of an OLED according to the invention.

It is specified that in FIG. 1 the proportions between the various elements represented are not respected, in order to facilitate the reading thereof.

The OLED 1, illustrated schematically and not to scale in FIG. 1, successively comprises:
a transparent substrate 10 with a diffusing layer 2 according to the invention,
a first transparent electrically conductive coating 11 which forms an electrode,
a layer (single-layer or multilayer) of organic material(s) 12,
a second electrically conductive coating 13 which forms a second electrode facing the organic layer and preferably forming a reflective or semi-reflective surface intended to send back the light emitted by the organic layer 12 in the opposite direction, of that of the transparent substrate 10.

The transparent substrate 10 has a thickness suitable for the desired final application (lighting device).

The glass is of standard composition or may be a glass referred to as, in a known manner, "extra-clear" glass since it confers a minimized light absorption. The substrate 10 comprises, along its largest dimensions, a first face 10a and a second opposite face 10b, the first face 10a comprising the first electrode 11, whereas the second face 10b opposite is provided with the diffusing layer 2.

The diffusing layer 2 is added to the substrate 10 by screen printing or any other suitable technique such as by coating, by impregnation in solution (dip-coating), by spraying, etc.

The diffusing layer 2 comprises a vitreous binder 20 and diffusing elements 21.

The diffusing layer 2 preferably contains a proportion of 30% by total weight of the layer of diffusing particles of alumina 21 having a size of the order of 600 nm.

The proportion of vitreous binder 20 is around 70% by total weight of the layer 2.

The vitreous binder comprises between 40% and 60% by weight of bismuth oxide $Bi_2O_3$ inclusive of these values, or even between 45% and 58% by weight of bismuth oxide $Bi_2O_3$ inclusive of these values.

Compositions and Tests

Two examples of compositions of the vitreous binder of the diffusing layer are given in table 1 (in % by weight of the vitreous binder)

TABLE 1

|  | Comparative Ex. | Ex. 1 |
| --- | --- | --- |
| $SiO_2$ | 12.1 | 3.8 |
| $Al_2O_3$ | 0.2 | 0.40 |
| $B_2O_3$ | 27.75 | 15.60 |
| CaO | 0 | 0 |
| BaO | 0 | 0 |
| $Li_2O$ | 0 | 0 |
| $Na_2O$ | 16.7 | 2.50 |
| $K_2O$ | 0 | 0.80 |
| ZnO | 41.5 | 17.40 |
| $Bi_2O_3$ | 0 | 54.60 |
| $ZrO_2$ | 0.1 | 4.40 |
| F | 1.6 | 0 |
| SrO | 0 | 0 |
| $La_2O_3$ | 0 | 0 |

(to within measurement errors, the sum of the share of each constituent is equal to 100).

Example 1 is an example according to the invention, the comparative example is a layer with a vitreous binder having a high content of $Bi_2O_3$ and of ZnO and without $Bi_2O_3$, this comparative diffusing layer containing, like the layer from example 1, a proportion of 30% by total weight of the layer of diffusing particles of alumina.

Each of these two examples has undergone an entire series of tests (treatments) with acids (being used, for example, for electrode etching), with bases (being used, for example, for the removal of a resist mask or for substrate cleaning), with commercial detergents and solvents (being used, for example, for substrate cleaning), summed up in table 2 below:

The chemical resistance of the two examples is assessed visually according to the following resistance scale:

level N5: total loss of the layer;

level N4: strong degradation with local disappearance via dissolution;

level N3: significant degradation with change of color such as iridescence, bleaching or whitening;

TABLE 2

| SYSTEM | | | Comparative Ex. | | | Ex. 1 | | |
|---|---|---|---|---|---|---|---|---|
| REF (untreated) | Temperature (° C.) | Time (min) | Appearance | TL 77.0 | TD 70.0 | Appearance | TL 59.3 | TD 59.3 |
| Acids | | | | | | | | |
| HCl pH 2 | 25 | 10 | N3 | 62.5 | 62.2 | N1 | 59.3 | 59.3 |
| | 40 | 10 | N3 | 63.3 | 62.7 | N2 | 57.4 | 57.3 |
| HCl pH 4 | 25 | 10 | N1 | 77.5 | 70.7 | N1 | 59.4 | 59.3 |
| | 40 | 10 | N1 | 77.1 | 70.4 | N1 | 59.6 | 59.6 |
| $H_2SO_4$ pH 2 | 25 | 10 | N3 | 61.2 | 61.7 | N2 | 56.7 | 56.6 |
| | 40 | 10 | N3 | 64.8 | 64.0 | N2 | 59.9 | 59.7 |
| $H_2SO_4$ pH 4 | 25 | 10 | N1 | 77.0 | 70.4 | N1 | 59.3 | 59.3 |
| | 40 | 10 | N2 | 77.0 | 70.6 | N1 | 59.5 | 59.3 |
| $H_3PO_4$ pH 2 | 25 | 10 | N2 | 66.5 | 65.5 | N2 | 59.2 | 59.1 |
| | 40 | 10 | N3 | 61.3 | 61.3 | N1 | 59.6 | 59.4 |
| $H_3PO_4$ pH 4 | 25 | 10 | N1 | 77.2 | 70.4 | N1 | 59.5 | 59.4 |
| | 40 | 10 | N2 | 77.0 | 71.0 | N1 | 59.6 | 59.3 |
| Merck Isishape 4S | 40 | 10 | N4 | X | X | N2 | 58.3 | 58.3 |
| Bases | | | | | | | | |
| NaOH pH 11 | 25 | 10 | N1 | 76.7 | 71.0 | N1 | 60.0 | 60.0 |
| | 40 | 10 | N1 | 77.0 | 71.0 | N1 | 60.0 | 60.0 |
| NaOH pH 13 | 25 | 10 | N1 | 77.0 | 71.0 | N1 | 60.3 | 60.2 |
| | 40 | 10 | N1 | 77.0 | 71.0 | N1 | 60.0 | 60.0 |
| Commercial detergents | | | | | | | | |
| Franklab Neutrax 1% pH~4 | 25 | 10 | N3 | 59.4 | 59.0 | N1 | 60.0 | 59.8 |
| | 40 | 10 | N3 | 54.9 | 54.5 | N2 | 60.6 | 60.4 |
| Franklab TFD 66 4% pH~11 | 25 | 10 | N3 | 75.9 | 71.9 | N1 | 60.1 | 60.0 |
| | 40 | 10 | N3 | 71.4 | 70.2 | N2 | 60.4 | 60.2 |
| RBS 2% | 25 | 10 | N2 | 76.3 | 70.3 | N1 | 59.2 | 59.0 |
| | 40 | 10 | N2 | 76.1 | 70.3 | N1 | 59.7 | 59.6 |
| Solvents | | | | | | | | |
| Ethanol 95% | 25 | 10 | N1 | 76.8 | 70.0 | N1 | 59.9 | 59.8 |
| Acetone | 25 | 10 | N1 | 77.0 | 70.0 | N1 | 59.5 | 59.4 |
| Isopropanol | 25 | 10 | N1 | 76.9 | 70.0 | N1 | 59.5 | 59.3 |

The commercial detergents of the cleaning baths are used at the volume dilutions cited in table 2.

The detergent Franklab Neutrax consists of a mixture of organic acids such as acetic acid and of sequestrants, their dilution of which to 1% gives the medium a moderate acid pH having an approximate value of 4.

The detergent Franklab TFD66 is a slightly foaming alkaline detergent that contains sequestrants and gives a pH of the order of 11 by dilution to 4%.

RBS 2% is a basic alkaline solution which is a mixture of ionic and non-ionic+phosphate and polyphosphate detergents at a concentration, by volume, of 2%, and only having a pH of the order 11.

Each test is carried out by immersing, in the bath specified in the left-hand column, a test specimen having a width of 4 cm and a height of 7 cm and a thickness of 2 mm, each test specimen being immersed to 80% of its height in the bath, the test specimen consisting only of the substrate coated with the diffusing layer of around 15 μm.

level N2: start of attack with appearance of the front delimiting the partial immersion and which corresponds to the liquid-air interface;

level N1: no visible attack.

The changes are also assessed by variation of the values of the light transmission (TL) and of the diffuse transmission (TD). These values are measured with a device of the Hazemeter BYK type.

Via the matrix containing bismuth oxide (example 1), the levels of the light transmission TL and of the diffuse transmission (TD) remain within the desired range for extraction on the air side.

As can be seen in table 2, the layers from example 1 comprising bismuth oxide tolerate 10 min of immersion at 25° C. or 40° C. in the following baths:

acid at pH 4: hydrochloric acid, sulfuric acid, phosphoric acid;

commercial detergents: Franklab Neutrax 1% pH 4, Franklab TFD 66 4% pH 11 and RBS 25 at 2%.

These layers from example 1 have a reinforced resistance with respect to the layers of the comparative example during immersion for 10 min in the following baths:

acid at pH 2 and 25° C.; hydrochloric acid, phosphoric acid;

commercial detergents at 25° C. and 40° C.: Franklab Neutrax 1% pH 4, Franklab TFD 66 4% pH 11 and RBS at 2%.

These results of good chemical resistance have been corroborated with tests in sodium hydroxide at pH 11 and pH 13 and also with ultrasound tests.

Results just as satisfactory are also obtained in an example 1a: this is a diffusing layer with a binder of identical composition to example 1 and without the addition of diffusing particles. The porosities (and the crystals) form diffusing elements.

Two other compositions of the vitreous binder are given in table 3 below, the diffusing layers with these binders and without addition of diffusing particles have been tested with acids, bases, commercial detergents and solvents and gave results similar to those of example 1.

TABLE 3

|  | Ex. 2 | Ex. 3 |
|---|---|---|
| $SiO_2$ | 3.9 | 4.14 |
| $Al_2O_3$ | 0.4 | 0.6 |
| $B_2O_3$ | 16.4 | 10 |
| CaO | 0 | 0.04 |
| BaO | 0 | 0 |
| $Li_2O$ | 0 | <0.05 |
| $Na_2O$ | 2.6 | 2.15 |
| $K_2O$ | 0.8 | 0.03 |
| ZnO | 18.3 | 25.4 |
| $Bi_2O_3$ | 57.5 | 57.6 |
| $ZrO_2$ | 0 | 0 |
| SrO | 0 | 0 |
| $La_2O_3$ | 0 | 0 |

(to within measurement errors, the sum of the share of each constituent is equal to 100.)

Figure 2A:
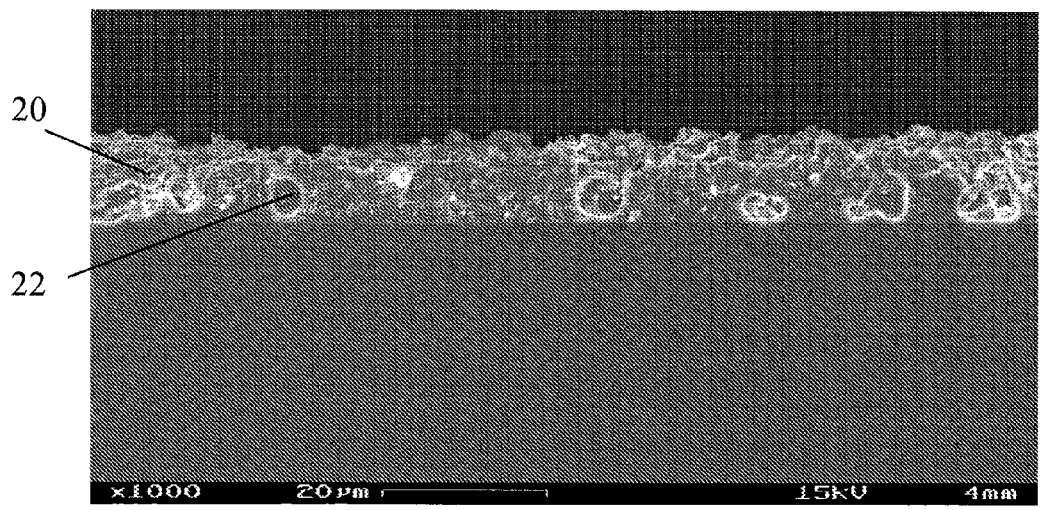
FIG. 2a shows a cross-sectional and tilted SEN view at a magnification of 1000, of a diffusing layer according to the invention with a vitreous binder containing bismuth oxide with 30% alumina and large porosities.

FIG. 2a shows a cross-sectional and tilted SEM view, at a magnification of 1000 (scale of 20 μm on the view) of the diffusing layer from example 1.

The large porosities 22 are easily observable.

Figure 2B:
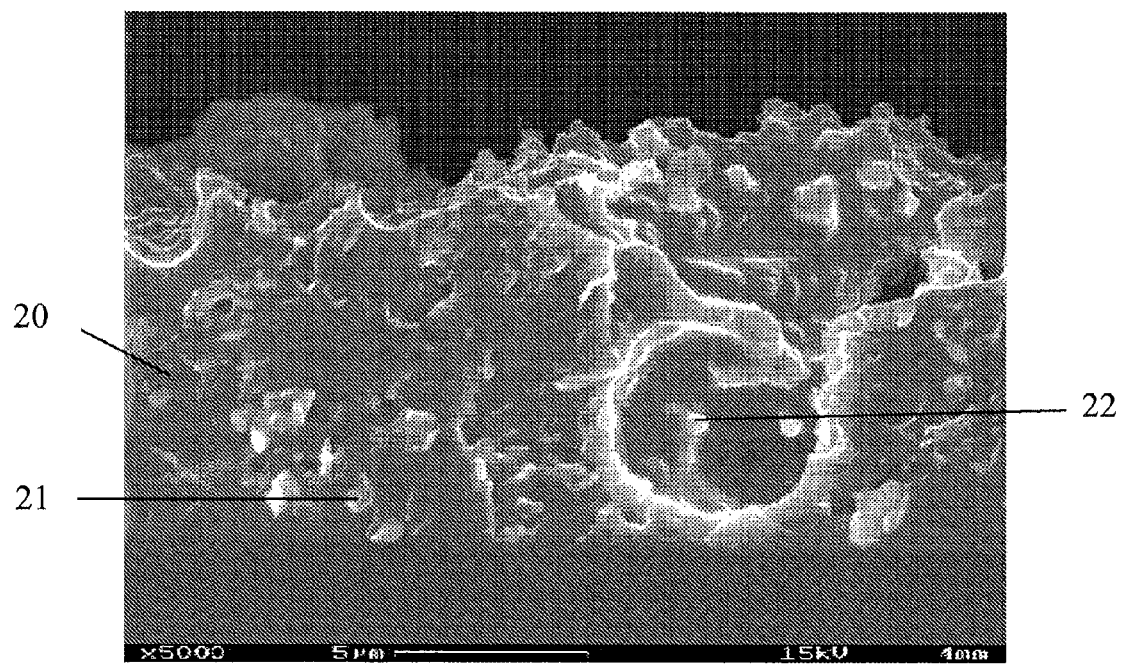
FIG. 2b shows a cross-sectional and tilted SEN view, at a magnification of 5000, of a diffusing layer according to the invention with a vitreous binder containing bismuth oxide with 30% alumina and large porosities.

FIG. 2b shows a cross-sectional and tilted SEM view, at a magnification of 5000 (scale of 5 μm on the view) of the diffusing layer 2 from example 1.

A micron-sized porosity is shown and the particles of alumina 21 are also observed.

Figure 3:
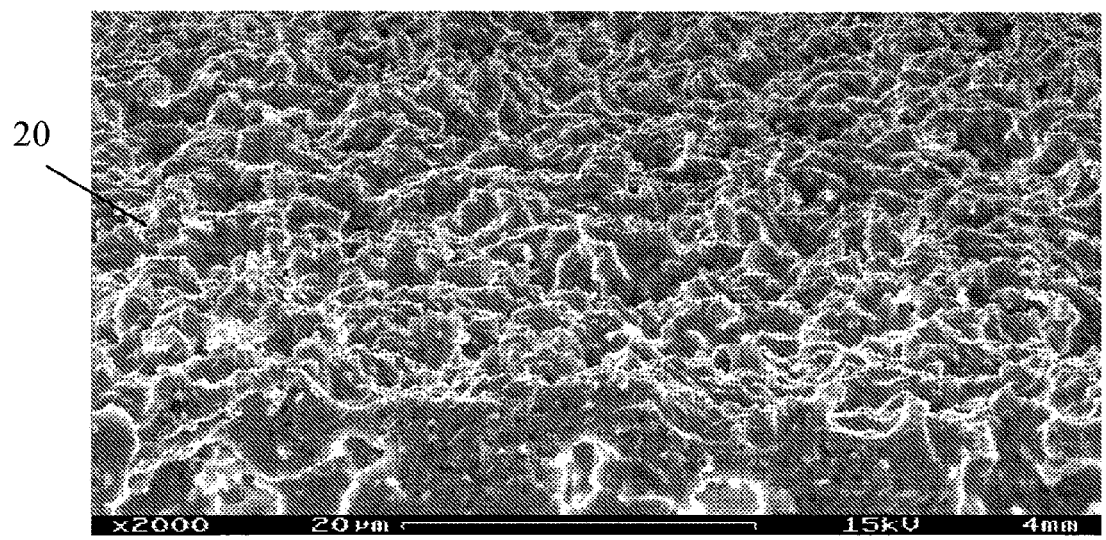
FIG. 3 shows a top SEN view, at a magnification of 1000, of a diffusing layer according to the invention with a vitreous binder containing bismuth oxide with 30% alumina and large porosities.

FIG. 3 shows a top SEM view, at a magnification of 5000 (scale of 20 μm on the view), of the diffusing layer 2 from example 1.

The surface roughness is easily observable.

The roughness parameter Ra is measured with a mechanical profilometer and Ra=1350 nm is obtained over an analysis length of 200 μm, in particular with a measurement step of 0.05 μm.

Figure 4:
FIG. 4 shows a cross-sectional and tilted SEN view, at a magnification of 1000, of a diffusing layer according to the invention with a vitreous binder containing bismuth oxide with porosities and without the addition of diffusing particles.

FIG. 4 shows a cross-sectional and tilted SEM view, at a magnification of 1000, of a diffusing layer 2 according to the invention with a vitreous binder 20 containing bismuth oxide with porosities 22 and without the addition of diffusing particles, corresponding to example 1a.

The porosities are of smaller size and the surface is smoother. The roughness parameter Ra is measured with a mechanical profilometer and Ra=30 nm is obtained over an analysis length of 200 μm, in particular with a measurement step of 0.05 μm.

Manufacture

The manufacture of the diffusing layer having reinforced chemical resistance can be carried out according to various industrial processes and preferably by screen printing.

The Paste

The screen-printing paste will consist, in weight proportions between 10% and 50%, of a screen-printing medium that will serve as a carrier for the particles in order to pass through the application screen.

This medium may be organic, consisting of alcohols, glycols, esters or terpineol, which, associated with fine mineral particles such as pyrogenic silica or cellulose ethers, gives threshold fluid properties to the paste.

The combustion of the organic medium generates the porosities.

The paste used is prepared, for example, by dispersion of a glass frit in a standard screen-printing medium composed of a mixture of glycols such as the medium 80840 sold by the company Ferro.

The rheological characteristics for the use of the paste by screen printing are optimized by the use of pyrogenic silica or cellulose ethers.

The solid fraction (forming the vitreous binder) is a glass frit with a high proportion of bismuth oxide as already indicated which confers the chemical resistance of the layer.

The pasting of the constituents takes place at high speed in planetary mixers and disc dispersers. Low-speed systems may also be used in addition, whether before or after the high-speed operation. These low-speed systems consist of stirrers of kneader or beater type or else flasks containing beads which are placed, for several hours, on roller mixers moved at low speeds of a few revolutions per minute. The quality of the paste is assessed by the absence of grains or aggregates using a Hegman gauge.

The Deposition

The deposition machines may be of reduced format of electronic type (EKRA, DEK) or of industrial size (THIEME) such as for flat glass.

The screens will consist of a textile (e.g. polyester) or metallic mesh.

The masks may consist of a photosensitive resist or of metal sheets.

The coating tools and the doctor blade will be made of polymer, carbon or metal. The thicknesses deposited are between 10 and 100 μm on a glass substrate. The thickness is firstly controlled by the choice of the mesh of the screen and its tension.

The thickness is also controlled by the adjustments of the distance between the screen and the substrate and also the pressures and speeds of travel applied to the blade. The thicknesses will be controlled using a laser optical bench of Rodenstock type between a coated or uncoated zone.

The deposits are dried at a temperature of the order of 100 to 150° C. in an infrared or UV radiation tunnel, depending on the nature of the medium used.

The deposition of the diffusing layer may also be carried out by a means other than screen printing: for example by roll coating, dip coating, knifecoating, spraying, spin coating or else flow coating.

Changes of the powder-liquid ratios and the use of additive is used to adapt the rheology of the composition to the chosen deposition method. Two different deposition methods may be used successively in order to produce a stack of layers that are similar or have different compositions or have a gradient of one or more constituents.

Curing

The furnaces used may be dynamic, with transport on rollers such as for the curing of a motor vehicle rear window, or preferably static, with positioning on metal or glass-ceramic plates in order to maintain the flatness of the substrate. The curing temperature is greater than 580° C.

Resistance to Cleaning

The electronic sector commonly uses, in a clean room, substrates that may or may not comprise layers which must firstly withstand manual or automated cleaning procedures in baths. These cleaning procedures must rid the supports of any trace of organic or mineral material and also of particles. The substrates therefore successively pass through steps in contact with basic and acidic detergent solutions with intermediate rinsings. The cleaning power is enhanced by the presence of detergents, ultrasounds and at a temperature often close to 40° C.

solution and that which leaves an OLED with the solution. In order to ensure that the whole of the flux is collected in both cases, the two OLEDs are one by one, in a known manner, placed inside an integrating sphere.

For the 2 OLEDs, Orbeos® and Lumiblade®, the gain is substantially 40% regarding the examples with comparative diffusing layers (REF 2 and REF 2b) or diffusing layers according to example 1 (A1 and A1b), 40% with respect to the diodes without a diffusing plastic film (REF 1 and REF 1b).

Furthermore, for the 2 OLEDs, Orbeos® and Lumiblade®, the gain is substantially 25% for the examples with diffusing layers according to the invention without diffusing particles, produced according to example 1a, 25% with respect to the diodes without a diffusing plastic film (REF 1 and REF 1b).

Finally, table 4 below lists the optical path lengths $V_{c1}$ to $V_3$ for the aforementioned examples REF 1 to A1b.

TABLE 4

| | Path length | | | | |
|---|---|---|---|---|---|
| | $V_{c2}$ | $V_{c3}$ | $V_{c1}$ | $V_{c1}/V_{c2}$ | $V_{c1}/V_{c3}$ |
| REF 1 | $41 \times 10^{-3}$ REF 2 | $6 \times 10^{-3}$ A1 | $3 \times 10^{-3}$ | 0.07 | 0.5 |
| REF 1a | $55 \times 10^{-3}$ REF 2a | $17 \times 10^{-3}$ A1a | $7 \times 10^{-3}$ | 0.13 | 0.41 |
| REF 1b | $38 \times 10^{-3}$ REF 2b | $11 \times 10^{-3}$ A1b | $7 \times 10^{-3}$ | 0.18 | 0.64 |

The composition rich in bismuth oxide of the diffusing vitreous layer according to the invention gives it a high resistance in these aggressive media such as the aforementioned baths. A vitreous layer of the comparative example produced according to the same production process is completely destroyed under the same cleaning conditions.

OLED Performances

In order to demonstrate the role of the diffusing layer of the invention, measurements were made on the light extraction and on the colorimetric variations, starting from first, second and third commercially available organic light-emitting diodes for which the diffusing plastic film bonded to the second face was removed:

without adding another diffusing layer (examples REF 1, and REF 1a and REF 1b);

while adding a diffusing layer without bismuth oxide (examples REF 2, REF 2a and REF 2b) or while adding the diffusing layer of example 1 (examples A1 and A1a and A1b).

For examples REF 1, REF 2 and A1, use is therefore made of a first organic light-emitting diode for lighting known as Orbeos® sold by the company OSRAM and that gives a white light.

For the examples REF 1a, REF 2a and A1a, use is therefore made of a second organic light-emitting diode for lighting known as Lumiotec® sold by the company LUMIOTEC and that gives a white light.

For the examples REF 1b, REF 2b and A1b, use is therefore made of a third organic light-emitting diode for lighting known as Lumiblade® sold by the company PHILIPS and that gives a white light.

Firstly, the gain in extraction is noted. The gain in extraction is defined as the relative increase of the amount of light extracted, that is to say the ratio between the difference in the amount of light emitted by the device with and without the solution of the invention (addition of the diffusing layer), and the amount of light emitted by the device without the solution. In order to measure it, it is therefore a question of comparing the total luminous flux that leaves an OLED without the It is observed that the angular colorimetric variation is therefore much less with a diffusing layer and in particular with the diffusing layer according to the invention, thus ensuring a much more uniform white light.

It is thus noted that the diffusing layer according to the invention on the substrate simultaneously makes it possible to increase the gain in extraction of the OLED, to decrease the colorimetric variations of the light emitted in order to thus provide a more uniform light and to be chemically and thermally resistant.

The invention claimed is:

1. A support for an organic light-emitting diode device successively comprising a transparent substrate, made of mineral glass, provided with first and second opposite main faces, the substrate being coated on its second face with a diffusing layer which comprises a vitreous mineral binder and diffusing elements dispersed in the binder, wherein the vitreous binder comprises from 40% to 60% by weight of bismuth oxide $Bi_2O_3$, wherein the proportion of the vitreous binder is at least 20% of the total weight of the diffusing layer, and wherein the vitreous binder comprises, by weight:
from 0% to 10% of $SiO_2$,
from 0% to 5% of $Al_2O_3$,
from 8% to 25% of $B_2O_3$,
from 0% to 10% of CaO,
from 0% to 20% of BaO,
from 0% to 5% of $Li_2O$,
from 0% to 10% of $Na_2O$,
from 0% to 5% of $K_2O$,
from 0% to 5% of $ZrO_2$,
from 0% to 5% of SrO,
from 0% to 5% of $La_2O_3$.

2. The support as claimed in claim 1, wherein the binder has a composition made of water-soluble oxides, the total content of which is less than 15% by weight.

3. The support as claimed in claim 1, wherein the vitreous binder comprises from 5% to 30% by weight of ZnO.

4. The support as claimed in claim 3, wherein the vitreous binder comprises from 10% to 25% by weight of ZnO.

5. The support as claimed in claim 1, wherein the diffusing elements comprise volume porosities.

6. The support as claimed in claim 1, wherein the diffusing elements comprise diffusing particles, in a proportion of less than 60% of the total weight of the diffusing layer, and optionally volume porosities.

7. The support as claimed claim 6, wherein the proportion of the vitreous binder is from 40% to 80% of the total weight of the diffusing layer, and wherein the proportion of the diffusing particles made of alumina is from 20% to 60%.

8. The support as claimed in claim 1, wherein the diffusing elements comprise mineral diffusing particles selected from one or more of the following particles: particles of alumina, of zirconia $ZrO_2$, of silica $SiO_2$, of titanium oxide $TiO_2$, of $CaCO_3$ or of $BaSO_4$.

9. The support as claimed in claim 1, wherein the diffusing layer has a main outer surface open to the air which is rough, having a roughness defined by a roughness parameter Ra of greater than 500 nm over an analysis length of 200 μm.

10. The support as claimed in claim 9, wherein the roughness parameter Ra is greater than 900 nm.

11. The support as claimed in claim 1, wherein the substrate coated with the diffusing layer has a light transmission of at least 50% and a haze of at least 80%.

12. The support as claimed in claim 1, wherein a first transparent electrode, in the form of one or more layers is deposited on the first face of the substrate.

13. The electrode support as claimed in claim 12, comprising, above the first electrode, an organic light-emitting system configured to emit radiation in the visible range, and a second electrode, in the form of one or more layers deposited on the organic system on the opposite side to the first electrode.

14. A method comprising utilizing a support with a diffusing layer as claimed in claim 1, as a support in an organic light-emitting diode device for lighting.

15. An organic light-emitting diode device, comprising a support as claimed in claim 1.

16. The organic light-emitting diode device as claimed in claim 15, configured to emit as the output a spectrum of polychromatic light defined by its chromaticity coordinates in the CIE XYZ 1931 chromaticity diagram, between the spectrum emitted at 0° and the spectrum emitted at 75°, every 5°, and for which the path length $V_{c1}$ between the spectrum emitted at 0° and the spectrum emitted at 75°, and passing through the intermediate angles with a step of 5° is given by the formula $$V_{C1} = \sum_{\theta_i=0}^{\theta_i=75°} \sqrt{(x(\theta_i) - x(\theta_{i+1}))^2 + (y(\theta_i) - y(\theta_{i+1}))^2},$$

wherein the chromaticity coordinates for each spectrum of angle $\theta_i$ are expressed by the pair of coordinates $(x(\theta_i); y(\theta_i))$ in the CIE XYZ 1931 chromaticity diagram, and wherein, for a first reference organic light-emitting diode device differentiated by the absence of diffusing layer on the second face of the substrate, a second path length $V_{c2}$ is defined in an identical manner, and $V_{c1}N_{c2}$ is obtained of less than or equal to 0.25 $V_{c2}$ is less than or equal to $10^{-1}$, and/or for a second reference organic light-emitting diode device with a diffusing layer on the second face of the substrate, a layer that is differentiated by a vitreous binder without bismuth oxide, a third path length $V_{c3}$ is defined in an identical manner, and $V_{c1}N_{c3}$ is obtained of less than or equal to 0.9, and $V_{c3}$ is less than or equal to $10^{-1}$.

17. The support as claimed in claim 1, wherein the vitreous binder comprises from 45% to 58% by weight of bismuth oxide $Bi_2O_3$.

18. The support as claimed in claim 1, wherein the binder has a composition made of alkali metal oxides of sodium and potassium type.

19. The support as claimed in claim 1, wherein the vitreous binder comprises from 10% to 30% by weight of ZnO.

20. The support as claimed in claim 1, comprising an additional layer provided over said diffusing layer so that said diffusing layer is arranged between said additional layer and said substrate, wherein said additional layer comprises bismuth oxide $Bi_2O_3$ in an amount by weight that is greater than that of bismuth oxide $Bi_2O_3$ in said diffusing layer.

21. The support as claimed in claim 1, wherein the vitreous binder comprises from 51% to 60% by weight of bismuth oxide $Bi_2O_3$.

22. A support for an organic light-emitting diode device comprising:
a glass substrate having first and second opposite faces, the substrate being coated on the second face with a diffusing layer comprising a vitreous mineral binder and diffusing elements dispersed in the binder, wherein the vitreous binder comprises from 40% to 60% by weight of bismuth oxide $Bi_2O_3$, wherein the proportion of the vitreous binder is at least 20% of the total weight of the diffusing layer, and wherein said binder is free of phosphorus oxide, or niobium oxide, or both.

23. The support as claimed in claim 22, wherein the vitreous binder comprises from 8% to 25% by weight of $B_2O_3$ and from 10% to 30% by weight of ZnO.

24. A support for an organic light-emitting diode device comprising:
a glass substrate having first and second opposite faces, the substrate being coated on the second face with a diffusing layer comprising a vitreous mineral binder and diffusing elements dispersed in the binder,
wherein the vitreous binder consists essentially of, by weight,
from 40% to 60% of $Bi_2O_3$,
from 5% to 30% of ZnO,
from 0% to 10% of $SiO_2$,
from 0% to 5% of $Al_2O_3$,
from 8% to 25% of $B_2O_3$,
from 0% to 10% of CaO,
from 0% to 20% of BaO,
from 0% to 5% of $Li_2O$,
from 0% to 10% of $Na_2O$,
from 0% to 5% of $K_2O$,
from 0% to 5% of $ZrO_2$,
from 0% to 5% of SrO,
from 0% to 5% of $La_2O_3$, and
wherein the proportion of the vitreous binder is at least 20% of the total weight of the diffusing layer.

* * * * *